US012731769B2

(12) United States Patent
Kumar et al.

(10) Patent No.: US 12,731,769 B2
(45) Date of Patent: Sep. 8, 2026

(54) HIGHER PRESSURE PURGE FOR IMPURITY REDUCTION IN RADICAL TREATMENT CHAMBER

(71) Applicant: Applied Materials, Inc., Santa Clara, CA (US)

(72) Inventors: Pradeep Sampath Kumar, Agra (IN); Norman L. Tam, Cupertino, CA (US); Shashank Sharma, Fremont, CA (US); Eric R. Rieske, Livermore, CA (US); Victor Calderon, Sunnyvale, CA (US); Mahesh Ramakrishna, Basaveshwaranagar (IN); Michael P. Kamp, San Ramon, CA (US); Dongming Iu, Union City, CA (US); Edward T. Xia, Santa Clara, CA (US); Eric T. Tran, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 468 days.

(21) Appl. No.: 18/113,509

(22) Filed: Feb. 23, 2023

(65) Prior Publication Data

US 2024/0290585 A1 Aug. 29, 2024

(51) Int. Cl.
*H01J 37/32* (2006.01)
*H10W 20/00* (2026.01)

(52) U.S. Cl.
CPC .. *H01J 37/32834* (2013.01); *H01J 37/32449* (2013.01); *H01J 37/32522* (2013.01); *H01J 37/32899* (2013.01); *H10W 20/064* (2026.01); *H01J 37/32357* (2013.01); *H01J 37/32743* (2013.01); *H01J 2237/1825* (2013.01); *H01J 2237/336* (2013.01)

(58) Field of Classification Search
None
See application file for complete search history.

(56) References Cited

U.S. PATENT DOCUMENTS 4,855,016 A 8/1989 Jucha et al.
8,080,109 B2 * 12/2011 Okada ....................... B08B 5/00 134/1.1
2004/0219789 A1 11/2004 Wood et al.
2015/0093891 A1 * 4/2015 Zope ................. H01L 21/28568 438/618

(Continued)

FOREIGN PATENT DOCUMENTS

KR 2005-0101339 A 10/2005
KR 20090043553 5/2009
KR 2016-0063378 A 6/2016

OTHER PUBLICATIONS

U.S. Appl. No. 17/886,269, filed Aug. 11, 2022.

(Continued)

*Primary Examiner* — Shamim Ahmed
(74) *Attorney, Agent, or Firm* — Patterson + Sheridan, LLP

(57) ABSTRACT

A method of post-deposition processing includes performing a preheat process in a radical treatment chamber, the preheat process comprising exposing a substrate having a metal layer formed thereon to purge gas and purging the purge gas at a pressure of between 400 Torr and 535 Torr, and performing a radical treatment process in the radical treatment chamber, the radical treatment process comprising exposing the substrate to radical species.

14 Claims, 10 Drawing Sheets

(56) References Cited

U.S. PATENT DOCUMENTS

| | | | | |
|---|---|---|---|---|
| 2020/0402792 | A1 | 12/2020 | Ke et al. | |
| 2022/0186370 | A1 | 6/2022 | Nannapaneni et al. | |
| 2022/0251708 | A1* | 8/2022 | Zhang | C23C 16/4405 |
| 2022/0298620 | A1* | 9/2022 | Spuller | C23C 8/02 |
| 2023/0128128 | A1* | 4/2023 | Sampath Kumar | H01L 21/324 438/795 |

OTHER PUBLICATIONS

International Search Report and Written Opinion dated May 8, 2024 for Application No. PCT/US2024/012334.

Korean Office Action for Application No. 10-2025-7031847 dated Feb. 12, 2026.

* cited by examiner

510

512

514

516

| | Preheat with $H_2$ in Radical Treatment Chamber (Block 404) | Radical Treatment with H* in Radical Treatment Chamber (Block 406) | Vacuum Break | Thermal Anneal with $H_2$ (Block 408) | Sheet Resistance Rs Reduction |
|---|---|---|---|---|---|
| #1 | No | No | - | In Thermal Anneal Chamber | 25.6% |
| #2 | Low Pressure | Yes | - | No | 21.3% |
| #3 | Low Pressure | Yes | Yes | In Thermal Anneal Chamber | 21.4% |
| #4 | Low Pressure | Yes | No | In Thermal Anneal Chamber | 19.9% |

FIG. 5B

| | Preheat with $H_2$ in Radical Treatment Chamber (Block 404) | Radical Treatment with H* in Radical Treatment Chamber (Block 406) | Vacuum Break | Thermal Anneal with $H_2$ (Block 408) | Sheet Resistance Rs Reduction |
|---|---|---|---|---|---|
| #5 | High Pressure | Yes | - | No | 28.7% |
| #6 | High Pressure | Yes<br>More Flow | - | No | 29.7% |
| #7 | High Pressure | Yes<br>More Flow | - | In Radical Treatment Chamber | 29.9% |
| #8 | Low Pressure | Yes | - | In Radical Treatment Chamber | 19.5% |

FIG. 5C

| Process Condition | Cu Grain Size | Increase in Cu Grain Size | Sheet Resistance Rs Reduction |
|---|---|---|---|
| No process | 131Å | Reference | |
| Thermal Anneal in Thermal Anneal Chamber Only - #1 | 244Å | 86% | 25.6% |
| Radical Treatment Only - #2 | 220Å | 68% | 21.3% |
| Preheat In Radical Treatment Chamber (Block 404) at High Pressure - #6 | 247Å | 89% | 29.7% |
| Preheat (Block 404) at 530 Torr + Radical Treatment (Block 406) + Thermal Anneal (Block 408) at High Pressure in Radical Treatment Chamber - #7 | 263Å | 101% | 29.9% |

FIG. 6B

HIGHER PRESSURE PURGE FOR IMPURITY REDUCTION IN RADICAL TREATMENT CHAMBER

BACKGROUND

Field

The present disclosure relates to transistor devices and methods for manufacturing transistor devices. More particularly, the present disclosure relates to combined radical and thermal processes to enhance performance of Cu back end of line (BEOL) stack and methods for manufacturing the same.

Description of the Related Art

In advanced logic technology nodes, interconnects significantly affect power, performance, area, and reliability of integrated circuits. There has been demand to reduce sheet resistances in back-end-of-line (BEOL) film stacks, typically with copper (Cu) interconnects, by lowering oxygen (O) impurities in the film stacks and increasing copper (Cu) grain sizes. The ability of controlling oxygen (O) impurities during the fabrication process increases device yield, and increases reliability of performance of the BEOL stacks.

Therefore, there is a need for improved methods, systems, and apparatus that facilitate lower sheet resistances and increased grain sizes in film stacks.

SUMMARY

Embodiments of the present disclosure provide a method of post-deposition processing. The includes performing a preheat process in a radical treatment chamber, the preheat process comprising exposing a substrate having a metal layer formed thereon to purge gas and purging the purge gas at a pressure of between 400 Torr and 535 Torr, and performing a radical treatment process in the radical treatment chamber, the radical treatment process comprising exposing the substrate to radical species.

Embodiments of the present disclosure also provide a method of post-deposition processing. The includes performing a preheat process in a radical treatment chamber, the preheat process comprising exposing a substrate having a metal layer formed thereon to purge gas and purging the purge gas at a pressure of between 400 Torr and 535 Torr, performing a radical treatment process in the radical treatment chamber, the radical treatment process comprising exposing the substrate to radical species, and performing a thermal anneal process in the radical treatment chamber, the thermal anneal process comprising exposing the substrate to the purge gas and purging the purge gas at a pressure of between 400 Torr and 535 Torr.

Embodiments of the present disclosure further provide a system for post-deposition processing. The system includes a cluster tool comprising a mainframe, a radical treatment chamber coupled to the mainframe, the radical treatment chamber comprising a first process volume, a thermal anneal chamber coupled to the mainframe, the thermal anneal chamber comprising a second process volume, and a controller comprising a processor and a memory comprising instructions that, when executed by the processor, cause a plurality of operations to be conducted, the plurality of operations including performing a preheat process in the radical treatment chamber, the preheat process comprising exposing a substrate having a metal layer formed thereon to purge gas and purging the purge gas at a pressure of between 500 Torr and 535 Torr, and performing a radical treatment process in the radical treatment chamber, the radical treatment process comprising exposing the substrate to radical species.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIGS. 5B and 5C show implementations of post-deposition processes on the example film stack.

FIGS. 6A and 6B show correlation between copper (Cu) grain size and sheet resistance of a metal layer of the example film stack.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure relate to methods, systems, and apparatus for conducting a purging operation at a high pressure, a radical treatment operation, and a thermal annealing operation on a substrate. In one aspect, the purging operation and the radical treatment operation are conducted in a radical treatment chamber, and the annealing operation is conducted in the same radical treatment chamber.

Figure 1:
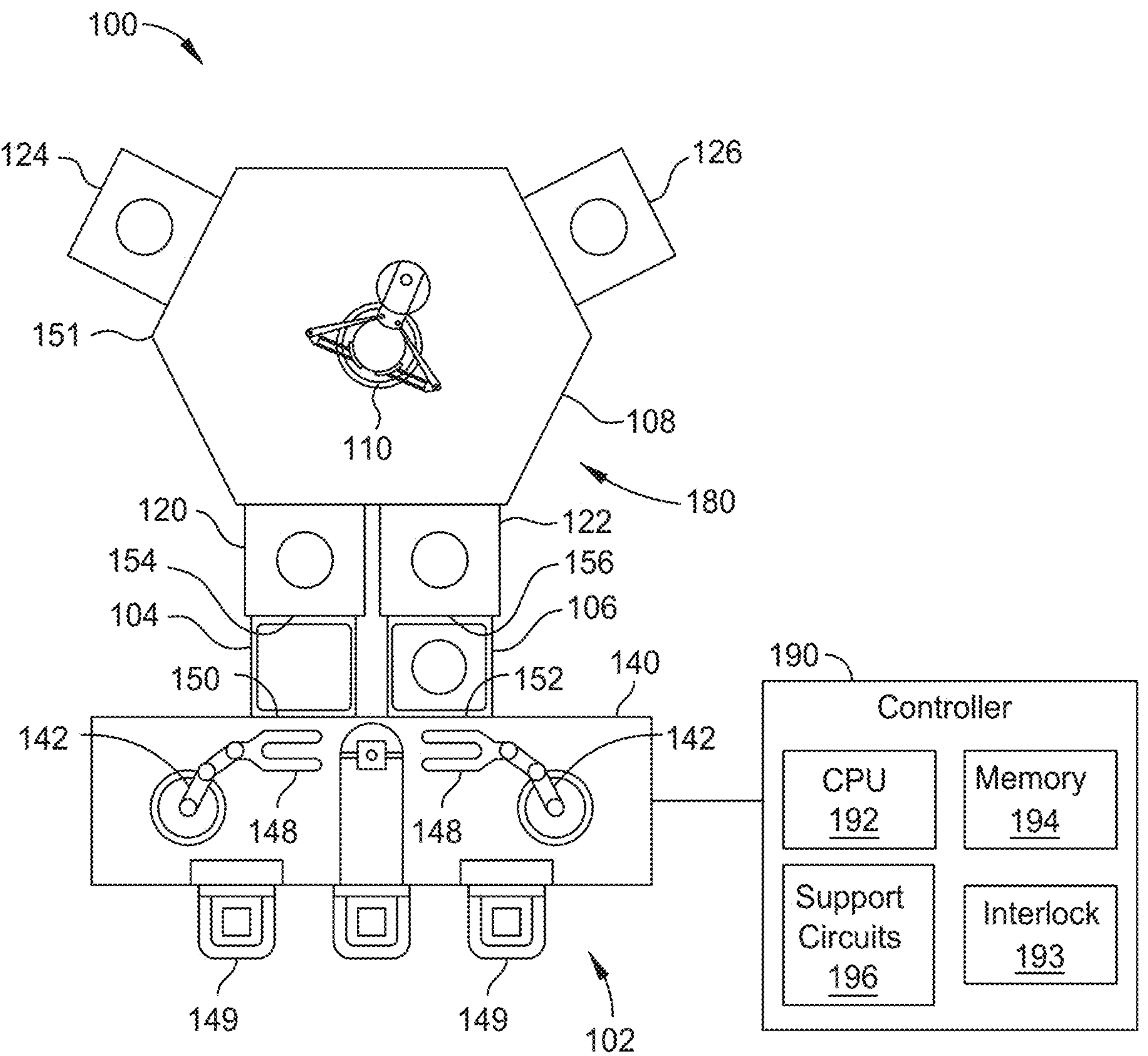
FIG. 1 is a schematic top-view diagram of a system for processing substrates, according to one implementation.

FIG. 1 is a schematic top-view diagram of a system 100 for processing substrates, according to one implementation. The system 100 includes a cluster tool 180. The cluster tool 180 includes a factory interface 102, one or more transfer chambers 108 (one is shown) with a transfer robot 110 disposed therein. The cluster tool 180 includes one or more radical treatment chambers 120, 122 (two are shown) and one or more thermal anneal chambers 124, 126 (two are shown) mounted to a mainframe 151 of the cluster tool 180. The one or more radical treatment chambers 120, 122 are each configured to conduct a radical treatment operation on substrates. The one or more thermal anneal chambers 124, 126 are each configured to conduct an annealing operation on substrates.

As detailed herein, substrates in the system 100 can be processed in and transferred between the various chambers without being exposed to an ambient environment exterior to the cluster tool 180. For example, substrates can be processed in and transferred between the various chambers in a low pressure or vacuum environment (e.g., 20 Torr or less) without breaking the low pressure or vacuum environment between various processes performed on the substrates in the system 100. In one embodiment, which can be combined with other embodiments, the system 100 provides the integrated cluster tool 180 for conducting processing operations on substrates.

In the implementation shown in FIG. 1, the factory interface 102 includes a docking station 140 and factory interface robots 142 to facilitate transfer of substrates. The docking station 140 is configured to accept one or more front opening unified pods (FOUPs) 149. In one embodiment, which can be combined with other embodiments, each factory interface robot 142 includes a blade 148 disposed on one end of the respective factory interface robot 142 configured to transfer substrates from the factory interface 102 to load lock chambers 104, 106.

The load lock chambers 104, 106 have respective doors 150, 152 interfacing with the factory interface 102 and respective doors 154, 156 interfacing with the one or more radical treatment chambers 120, 122. The one or more radical treatment chambers 120, 122 have respective doors interfacing with the transfer chamber 108, and the one or more thermal anneal chambers 124, 126 have respective doors interfacing with the transfer chamber 108.

The doors can include, for example, slit openings with slit valves for passing substrates therethrough by the transfer robot 110 and for providing a seal between respective chambers to prevent a gas from passing between the respective chambers. A door can be open for transferring a substrate therethrough, and otherwise closed.

The load lock chambers 104, 106, the transfer chamber 108, the radical treatment chambers 120, 122, and the thermal anneal chambers 124, 126 may be fluidly coupled to a gas and pressure control system. The gas and pressure control system can include one or more gas pumps (e.g., turbo pumps, cryo-pumps, roughing pumps, vacuum pumps,), gas sources, various valves, and conduits fluidly coupled to the various chambers.

The system 100 includes a controller 190 configured to control the system 100 or components thereof. For example, the controller 190 may control the operation of the system 100 using a direct control of the chambers 104, 106, 108, 120, 122, 124, 126 of the system 100 or by controlling controllers associated with the chambers 104, 106, 108, 120, 122, 124, 126. The controller 190 is configured to control the gas and pressure control system. In operation, the controller 190 enables data collection and feedback from the respective chambers and the gas and pressure control system to coordinate and control performance of the system 100.

The controller 190 generally includes a central processing unit (CPU) 192, an interlock 193, a memory 194, and support circuits 196. The CPU 192 may be one of any form of a general purpose processor that can be used in an industrial setting. The memory 194, or non-transitory computer readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may include cache, clock circuits, input/output subsystems, power supplies, and the like.

The various methods (such as the method 400) and operations disclosed herein may generally be implemented under the control of the CPU 192 executing computer instruction code stored in the memory 194 (or in memory of a particular processing chamber) as, e.g., a software routine. When the computer instruction code is executed by the CPU 192, the CPU 192 controls the chambers to conduct processes in accordance with the various methods and operations described herein. In one embodiment, which can be combined with other embodiments, the memory 194 includes instructions stored therein that, when executed, cause the methods (such as the method 400) and operations (such as the blocks 402, 404, 406, and 408) described herein to be conducted. The interlock 193 is implemented for safety purposes to control over temperature switches, cable-in-place switches, and match-in-place switches, etc. The interlock 193 is open when failure happens, and the system shuts off.

Other processing systems in other configurations are contemplated. For example, more or fewer processing chambers may be coupled to a transfer apparatus. In the implementation shown in FIG. 1, the transfer apparatus includes the transfer chamber 108. In other implementations, more transfer chambers (e.g., two transfer chambers) may be implemented as a transfer apparatus in a system for processing substrates.

Figure 2A:
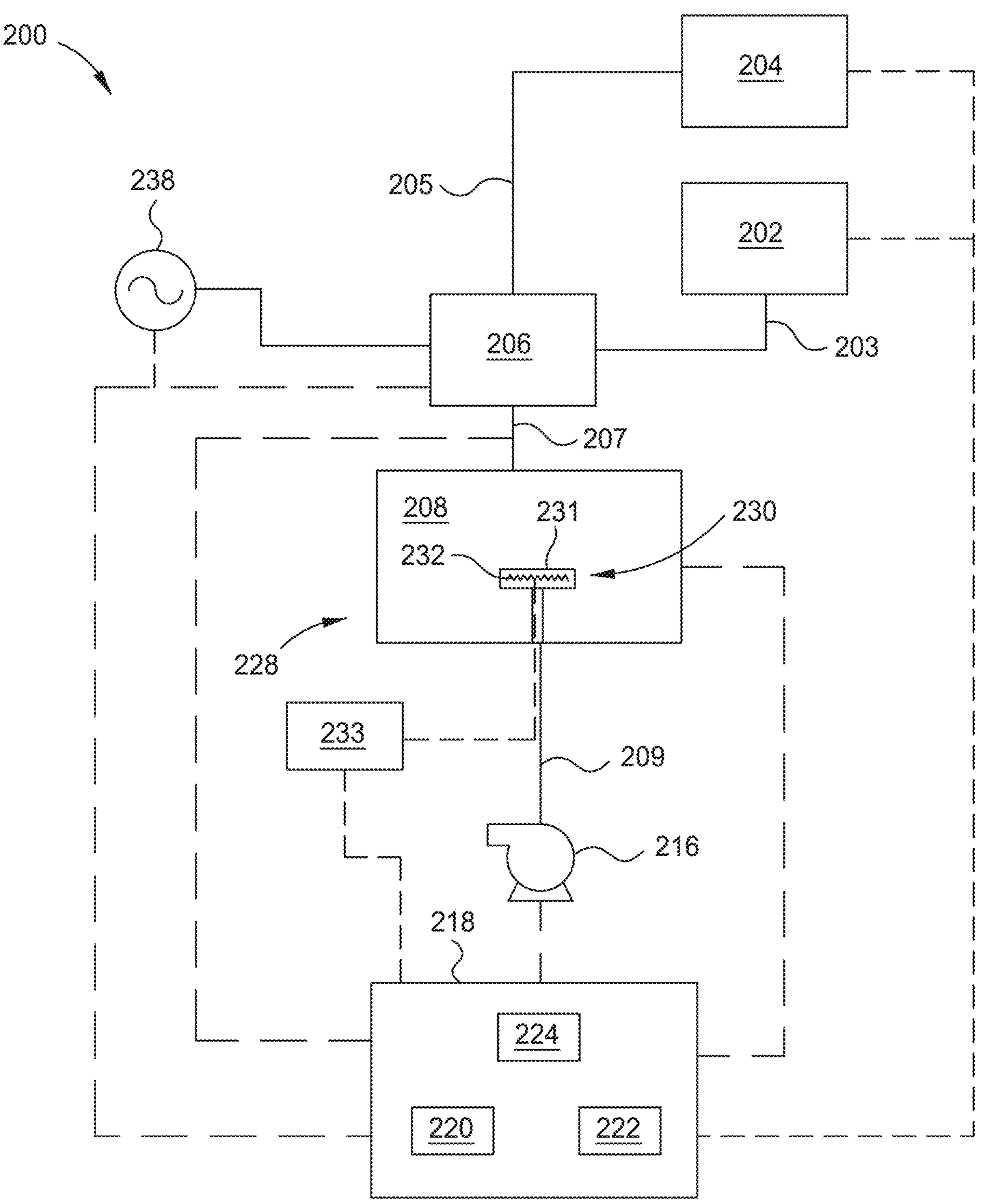
FIG. 2A is a schematic partial view of a system for thermally annealing substrates, according to one implementation.

FIG. 2A is a schematic partial view of a system 200 for thermally annealing substrates, according to one implementation. The system 200 includes a process chamber 228, such as the PYRA® chamber available from Applied Materials, Inc. of Santa Clara, Calif.

The system 200 can be used as at least part of each of the one or more thermal anneal chambers 124, 126 shown in FIG. 1 that are configured to conduct the annealing operation.

The system 200 also includes a remote plasma source (RPS) 206, and a gas line 207 coupling the RPS 206 to the process chamber 228. The present disclosure contemplates that in an in-situ plasma operation may be used in place of the RPS 206. The process chamber 228 can be used as at least part of each of the one or more thermal anneal chambers 124, 126 shown in FIG. 1. The process chamber 228 can be a heater based process chamber, or a rapid thermal processing (RTP) chamber, such as a rapid thermal anneal (RTA) chamber. The process chamber 228 can be any thermal processing chamber where delivery of at least one metastable radical molecular species and/or radical atomic species to a processing volume can be used. The process chamber 228 includes a pedestal heater 230 disposed in a processing volume 208. The pedestal heater 230 includes a base platform that includes a support surface 231. The support surface 231 is circular or rectangular in shape. The pedestal heater 230 includes one or more heater elements 232 embedded in the pedestal heater 230. The one or more heater elements 232 include one or more resistive heater elements, such as wire mesh(es) and/or resistive heating coil(s). The pedestal heater 230 includes a ceramic or aluminum body with the one or more heater elements 232 embedded in the ceramic or aluminum body. The one or more heater elements 232 are connected to a power source 233 that supplies power, such as electrical power (for example direct current or alternating current), to the one or more heater elements 232. The one or more heater elements 232 and the pedestal heater 230 are used to heat and control a temperature of a substrate (disposed on the pedestal heater 230) and a film stack of the substrate.

The RPS 206 is coupled to a power source 238. The power source 238 is used as an excitation source to ignite and maintain a plasma in the RPS 206. In one embodiment, which can be combined with other embodiments, the RPS 206 includes an inductively coupled plasma (ICP) source, a transformer coupled plasma (TCP) source, and/or a capacitively coupled plasma (CCP) source. In one embodiment, which can be combined with other embodiments, the power source 238 is a radio frequency (RF) source. In one example, which can be combined with other examples, the RF source delivers power between about 5 KW to about 9 KW, such as about 7 KW. In one embodiment, which can be combined with other embodiments, the RPS 206 includes one or more microwave resonators.

The RPS 206 is coupled to a first gas source 202 via a first gas conduit 203 and a second gas source 204 via a second gas conduit 205. The first gas source 202 supplies a first gas that includes one or more of hydrogen, oxygen, argon, and/or nitrogen. The flow rate of the first gas into the processing volume 208 is within a range of about 10 sccm to about 100,000 sccm. In one embodiment, which can be combined with other embodiments, nitrogen is supplied at a flow rate within a range of 10 sccm to 50,000 sccm, oxygen is supplied at a flow rate within a range of 10 sccm to 30,000 sccm, hydrogen is supplied at a flow rate within a range of 10 sccm to 50,000 sccm, and/or argon is supplied at a flow rate within a range of 10 sccm to 50,000 sccm.

The second gas source 204 supplies a second gas, such as oxygen gas. Oxygen plasma is formed using the RPS 206 by introducing about 1 sccm to about 50,000 sccm of oxygen gas, such as about 10 sccm to 50,000 sccm of oxygen gas introduced to the processing volume 208.

A vacuum pump 216 is used to maintain a gas pressure in the processing volume 208. The vacuum pump 216 evacuates post-processing gases and/or by-products of the process via an exhaust 209.

The system 200 includes a controller 218 configured to control the system 20 or components thereof. The controller 218 is configured to control the first gas source 202, the second gas source 204, the gas line 207, the vacuum pump 216, the chamber 228, the power source 233, and the power source 238.

The controller 218 generally includes a CPU 220, a memory 222, and support circuits 196. The CPU 220 may be one of any form of a general purpose processor that can be used in an industrial setting. The memory 222 or non-transitory computer readable medium, is accessible by the CPU 220 and may be one or more of memory such as random access memory (RAM), read only memory (ROM), floppy disk, hard disk, or any other form of digital storage, local or remote. The support circuits 224 are coupled to the CPU 220 and may include cache, clock circuits, input/output subsystems, power supplies, and the like.

Figure 2B:
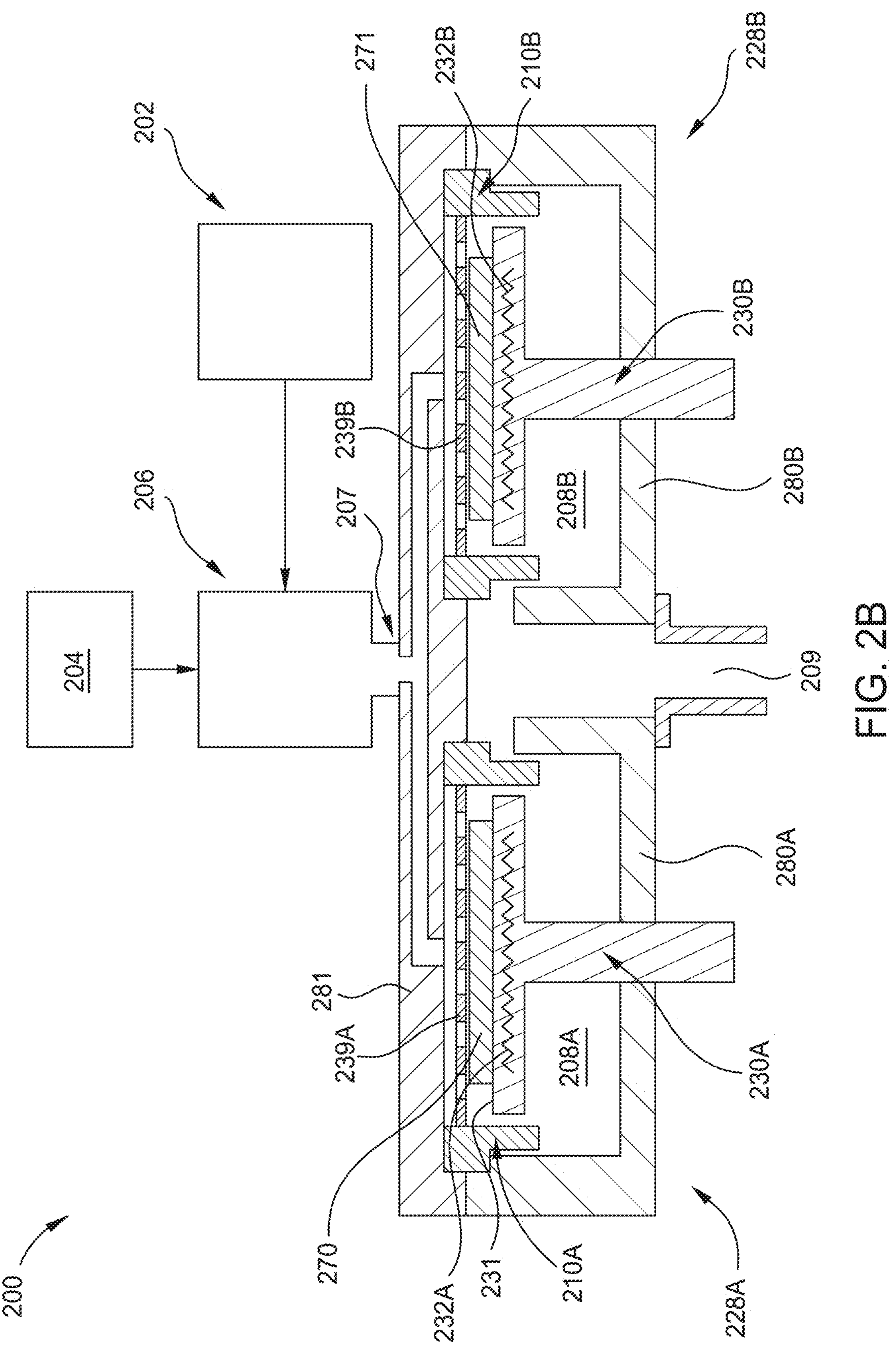
FIG. 2B is a schematic view of the system shown in FIG. 2A in a twin chamber configuration, according to one implementation.

Alternatively, the process chamber 228 can be employed in a twin chamber configuration as shown in FIG. 2B. FIG. 2B is a schematic view of the system 200 shown in FIG. 2A in a twin chamber configuration, according to one implementation. The twin chamber configuration may be used as at least part of each of the one or more thermal anneal chambers 124, 126. The twin chamber configuration includes two respective processing regions 228A, 228B that are in fluid communication with each other. Each processing region 228A, 228B can be configured to include one or more of the components, features, aspects, and/or properties of the process chamber 228 shown in FIG. 2A.

Each of the processing regions 228A, 228B includes a respective lower chamber body 280A, 280B. The present disclosure contemplates that the processing regions 228A, 228B can share the same lower chamber body. The processing regions 228A, 228B share the same upper chamber body 281. The present disclosure contemplates that the processing regions 228A, 228B can each respectively include a distinct upper chamber body.

Each of the processing regions 228A, 228B includes respective pedestal heaters 230A, 230B similar to the pedestal heater 230, respective one or more heater elements 232A, 232B similar to the one or more heater elements 232, and/or respective processing volumes 208A, 208B similar to the processing volume 208. The processing regions 228A, 228B share a single RPS 206 that provides the first gas (during a thermal anneal operation) and optionally the oxygen plasma (during an optional later clean operation to clean the processing regions 228A, 228B) to the processing volumes 208A, 208B. The RPS 206 is coupled to the first gas source 202 and the second gas source 204. Each of the processing regions 228A, 228B includes a respective process kit 210A, 210B. Each respective process kit 210A, 210B includes one or more components inside the respective one of the processing regions 228A, 228B, such as liners. The liners can be made from quartz, ceramic, or metal. The processing regions 228A, 228B are coupled to share a single controller (such as the controller 190), or can be coupled to separate controllers. The present disclosure contemplates that portions of the process kits 210A, 210B may move and/or include flow openings to allow the first gas and the oxygen plasma to flow to the exhaust 209. The system 200 can include a valve, disposed for example along the exhaust 209, such that the first gas and the oxygen plasma are not exhausted and are instead directed to the processing volumes 208A, 208B during the thermal anneal operation and an optional later clean operation. Each of the processing regions 228A, 228B includes respective gas distribution plates 239A, 239B.

A first substrate 270 and a second substrate 271 are directly supported respectively on the pedestal heaters 230A, 230B to undergo a thermal anneal operation.

Figure 3:
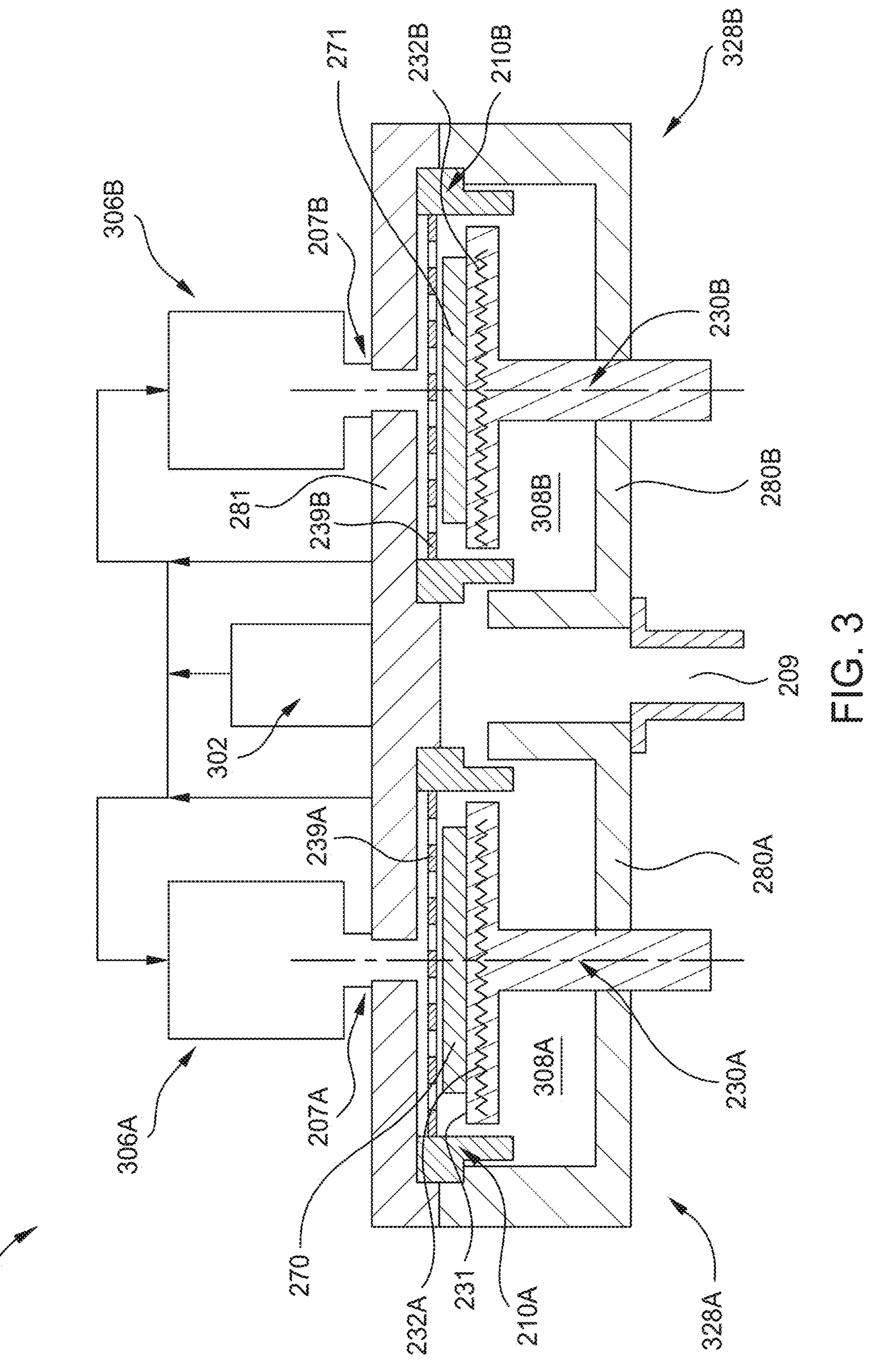
FIG. 3 is a schematic partial view of a system for processing substrates, according to one implementation.

FIG. 3 is a schematic partial view of a system 300 for processing substrates, according to one implementation. The system 300 is similar to the system 200 shown in FIGS. 2A and 2B, and includes one or more of the aspects, features, components, and/or properties thereof. The system 300 can be used as at least part of the one or more radical treatment chambers 120, 122 shown in FIG. 1 that are configured to conduct radical treatment operations. The system 300 includes a process chamber having two respective processing regions 328A, 328B. The processing regions 328A, 328B are similar to the processing regions 228A, 228B, and include one or more, but not all, of the aspects, features, components, and/or properties thereof.

Each of the processing regions 328A, 328B includes respective pedestal heaters 230A, 230B similar to the pedestal heater 230, respective remote plasma sources 306A, 306B similar to the RPS 206, respective gas lines 207A, 207B similar to the gas line 207, respective one or more heater elements 232A, 232B similar to the one or more heater elements 232, and/or respective processing volumes 308A, 308B similar to the processing volume 208. In one embodiment, which can be combined with other embodiments, the processing regions 328A, 328B can share a single RPS.

The system 300 includes a first gas source 302 similar to the first gas source 202 described above, and can include one or more of the aspects, features, components, and/or properties thereof. In one embodiment, which can be combined with other embodiments, each respective RPS 306A, 306B is coupled to share a single first gas source 302. In one embodiment, which can be combined with other embodiments, each RPS 306A, 306B can be coupled to a distinct first gas source. The first gas source 302 supplies one or more gases that include hydrogen, oxygen, and/or argon, such as pure hydrogen or a combination of a first gas flow of argon and a second gas flow of hydrogen or oxygen at any flow rate ratio of hydrogen or oxygen to argon, such as a flow rate ratio of hydrogen/oxygen:argon that is within a range of 1:350 to 150:1. In one embodiment, which can be combined with other embodiments, the first gas flow flows argon at a flow rate within a range of 10 sccm to 3,500 sccm to ignite plasma, and then the second gas flow flows hydrogen or oxygen at a flow rate within a range of 10 sccm to 1,500 sccm to provide hydrogen plasma or oxygen plasma.

Each RPS 306A, 306B generates hydrogen radicals using the gas, and supplies the hydrogen radicals to the respective second processing volumes 308A, 308B and to the first substrate 270 and the second substrate 271 during a radical treatment operation to clean the first and second substrates 270, 271 and reduce or remove contaminant particles from the first and second substrates 270, 271. The system 300 can include one or more ion filters (not shown) that filter out ions from the plasma generated using the RPSs 306A, 306B.

Figures 4, 5A:
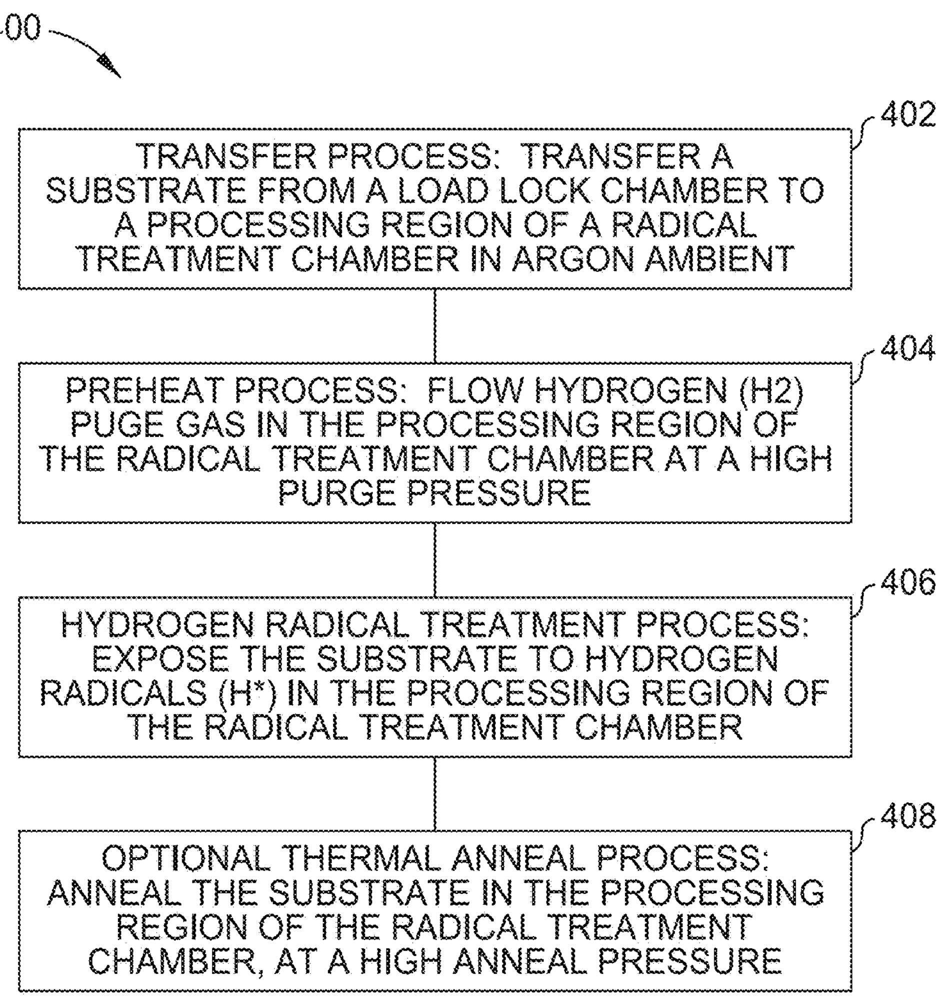
FIG. 4 is a schematic block diagram view of a method 400 of post deposition processing semiconductor substrates, according to one implementation.
FIG. 5A is a schematic view of an example film stack.

FIG. 4 is a schematic block diagram view of a method 400 of post-deposition processing semiconductor substrates, according to one implementation.

The method 400 begins with a transfer process in block 402, in which a substrate having a film stack deposited thereon is transferred from a load lock chamber, such as the load lock chambers 104, 106 shown in FIG. 1, to a processing region of a radical treatment chamber, such as the radical treatment chambers 120, 122 shown in FIG. 1 or the system 300 shown in FIG. 3. The film stack may include a metal layer 510, for example, of copper (Cu) or ruthenium (Ru), a liner layer 512, for example, of cobalt (Co), a barrier layer 514, for example, of tantalum nitride (TaN), and a dielectric layer 516, for example, of silicon oxide ($SiO_2$), as shown in FIG. 5A. The film stack may be formed by a chemical vapor deposition (CVD) operation), an etching operation, and/or a lithography operation.

The transfer process includes transferring the substrate from the load lock chamber to the processing region of the radical treatment chamber in argon (Ar) ambient at a transfer pressure of between about 400 Torr and about 535 Torr, such as about 530 Torr.

In block 404, a preheat process is performed in the radical treatment chamber. The preheat process includes replacing the argon (Ar) ambient with hydrogen ($H_2$) purge gas and flowing hydrogen ($H_2$) purge gas in the processing region of the radical treatment chamber at a high purge pressure of between about 400 Torr and about 535 Torr, such as about 530 Torr, at a preheat temperature of less than about 350 degrees Celsius, such as about 300 degrees Celsius, for a preheat time of between about 1 minute to about 10 minutes, such as about 1 minute.

Flow rate of the hydrogen ($H_2$) purge gas may be between about 10 liters per minute (LPM) and about 12 LPM, such as about 10 LPM.

In the preheat process in block 404, oxygen impurities may be removed from the metal layer 510.

In block 406, a hydrogen radical treatment process is performed in the radical treatment chamber.

The hydrogen radical treatment process includes exposing the substrate to radical species, such as hydrogen radicals (H*), in the processing region of the radical treatment chamber, at a treatment temperature of less than about 350 degrees Celsius, such about 300 degrees Celsius, at a treatment pressure of between about 0.35 Torr and about 0.45 Torr, such as about 0.4 Torr, for a treatment time of between about 1 minute and about 60 minutes, such as about 2 minutes.

The hydrogen radicals (H*) are supplied to the processing region of the radical treatment chamber at a flow rate of between about 1,300 sccm and about 2,200 sccm, such as about 1,350 sccm or 2,100 sccm, for a 300 mm diameter substrate.

The hydrogen radicals (H*) can be generated using one or more of a remote plasma source (RPS), an inductively coupled plasma (ICP) source, and/or one or more microwave resonators for in-situ generation.

In the hydrogen radical treatment process in block 406, metal elements (e.g., copper (Cu)) that were reduced from metal oxides (e.g., copper oxide) in the metal layer are re-flowed with hydrogen radicals (H*) and growth of metal (e.g., copper (Cu)) grains may begin.

In block 408, an optional thermal anneal process is performed in the radical treatment chamber, subsequent to the hydrogen radical treatment process in block 406.

The thermal anneal process includes annealing the substrate in the processing region of the radical treatment chamber, at an anneal temperature of about 300 degrees Celsius or greater, such as about 300 degrees Celsius, at an anneal pressure of between about 400 Torr and about 535 Torr, such as about 530 Torr, for an anneal time of less than about 4 minutes, such as about 2 minutes. In one embodiment, which can be combined with other embodiments, the annealing environment includes hydrogen ($H_2$).

Flow rate of the hydrogen ($H_2$) purge gas during the thermal anneal process may be between about 10 liters per minute (LPM) and about 12 LPM, such as about 10 LPM.

In some embodiments, the optional thermal anneal process in block 408 is performed in a thermal anneal chamber, such as the thermal anneal chambers 124, 126 shown in FIG. 1 or the system 200 shown in FIGS. 2A and 2B, that is coupled to the radical treatment chamber, in an integrated cluster tool, such as the cluster tool 180 shown in FIG. 1. The substrate is transferred from the radical treatment chamber to the thermal anneal chamber without breaking vacuum environment. During the thermal anneal process, the substrate can be heated using one or more lamp heaters and/or one or more resistive heaters that heat a pedestal on which the substrate is supported.

In the thermal anneal process in block 406, further growth of metal (e.g., copper (Cu)) grains may occur.

The present disclosure contemplates that the operations in blocks 404, 406, 408 can be repeated on the substrate being processed. The conducting of the method 400 in one or more iterations may further reduce a sheet resistance of the metal layer in a film stack.

EXAMPLES

Various operation parameters described herein can be used in relation to the method 400. The operation parameters facilitate reduced sheet resistances, and increased grain sizes in a metal layer of a film stack. The operation parameters also facilitate maintaining impurity levels (such as levels of carbon, hydrogen, and oxygen impurities) within similar and acceptable levels.

FIGS. 5B and 5C show eight implementations (#1, #2, #3, #4, #5, #6, #7, #8) of post-deposition processes on a film stack including a metal layer 510 of copper (Cu), a liner layer 512 of cobalt (Co), a barrier layer 514 of tantalum nitride (TaN), and a dielectric layer 516 of silicon oxide ($SiO_2$), as shown in FIG. 5A, and the operation parameters used therein.

In implementation #1, the post-deposition process includes only a thermal anneal in a thermal anneal chamber, such as the thermal anneal chambers 124, 126 shown in FIG. 1 or the system 200 shown in FIGS. 2A and 2B. Sheet resistance $R_s$ of the metal layer 510 is reduced by 25.6%. In implementation #2, the post-deposition process includes a preheat process at a low pressure of less than about 20 Torr and a hydrogen radical treatment process in a radical treatment chamber, such as the radical treatment chambers 120, 122 shown in FIG. 1 or the system 300 shown in FIG. 3. There is no improvement in reduction of sheet resistance $R_s$ of the metal layer 510 in implementation #2 as compared to implementation #1. In implementations #3 and #4, the post-deposition process includes a preheat process and a hydrogen radical treatment process as in implementation #2, and further a thermal anneal in a thermal anneal chamber. In implementation #3, there is vacuum break between the hydrogen radical treatment process and the thermal anneal process. In implementation #4, there is no air break between the hydrogen radical treatment process (in the radical treatment chamber) and the thermal anneal process (in the thermal anneal chamber) in an integrated cluster tool, such as the cluster tool 180 shown in FIG. 1. In implementations #3 and #4, there is no improvement in reduction of sheet resistance $R_s$ of the metal layer 510 as compared to implementation #1.

In implementations #5, #6, and #7, a preheat process (in block 404) is performed at a high pressure of between about 400 Torr and about 535 Torr in a radical treatment chamber, according to the embodiments of the present disclosure. There is significant improvement in reduction of sheet resistance $R_s$ of the metal layer 510 in implementations #5, #6, and #7 as compared to implementation #1.

In implementation #6, a flow rate of hydrogen radicals (H*) in a hydrogen treatment process (in block 406) is increased as compared to that in implementation #5. Comparison of implementations #5 and #6 indicates higher flow rate of hydrogen radicals (H*) in the hydrogen treatment process (in block 406) contributes to further reducing sheet resistance $R_s$ of the metal layer 510. Similarly, pressure and time of the preheat process (in block 404) and temperature, pressure, and time of the hydrogen treatment process (in block 406) can be adjusted to optimize the post-deposition process.

In implementation #7, the hydrogen treatment process (in block 406) is followed by a thermal anneal process (in block 408) in the same radical treatment chamber, according to the embodiments of the present disclosure. Sheet resistance $R_s$ of the metal layer 510 further decreases in implementation #7 as compared to implementations #5 and #6, which indicates the additional thermal anneal process contributes to reducing sheet resistance $R_s$ of the metal layer 510.

In implementation #8, the post-deposition process includes a preheat process at a low pressure of less than about 20 Torr and a hydrogen radical treatment process, as in implementation #2, and further a thermal anneal in the same radical treatment chamber as in implementation #7. There is no improvement in reduction of sheet resistance $R_s$ of the metal layer 510 in implementation #8 as compared to implementation #1. Comparison of implementations #7 and #8 indicates the preheat process at a high pressure of between about 400 Torr and about 535 Torr contributes to reducing sheet resistance $R_s$ of the metal layer 510.

Figure 5D:
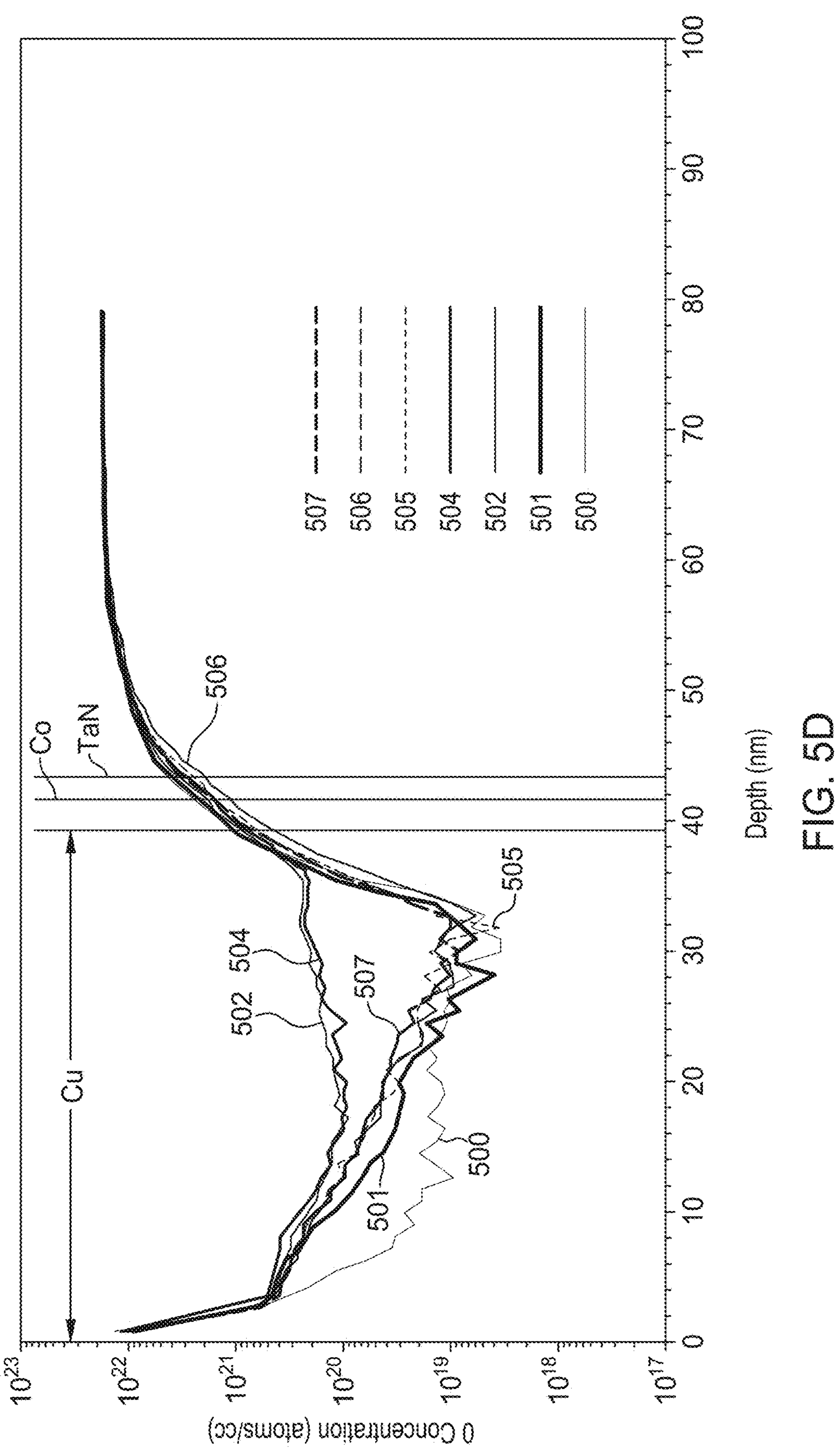
FIG. 5D shows oxygen impurity level in the example film stack in various implementations shown in FIGS. 5C and 5D.

FIG. 5D shows oxygen impurity level in the film stack in various implementations shown in FIGS. 5B and 5C. Plot 500 is oxygen impurity distribution of the film stack before a post-deposition process.

Plot 501 is an oxygen impurity distribution of the film stack after a post-deposition process according to implementation #1. In implementation #1, a preheat process is not performed and only a thermal anneal process in a thermal anneal chamber is performed. Plots 502 and 504 are oxygen impurity distributions of the film stack after a post-deposition process according to implementations #2 and #4, respectively. In implementations #2 and #4, a preheat process is performed at a low pressure of less than about 20 Torr.

Plots 505, 506, and 507 are oxygen impurity distributions of the film stack after a post-deposition process according to implementation #5, #6, and #7, respectively. In implementations #5, #6, and #7, a preheat process (in block 404) is performed at a high pressure of between about 400 Torr and about 535 Torr. Plots 505, 506, and 507 show significant reduction of oxygen impurities in the metal layer 510 at a depth of between about 15 nm and about 38 nm from the top of the metal layer 510 (at depth 0 nm). The reduction of oxygen impurities in implementations #5, #6, and #7 is equivalent to that in implementation #1.

The inventors have unexpectedly observed radical treatment processes alone (such as in implementations #5 and #6) show similar effects in reducing oxygen (O) impurity as a thermal anneal process (such as in implementation #1), which has been previously used to reduce oxygen impurities in a metal layer. This unexpected observation may be due to reducing copper oxide by a thermal anneal process being replaced by a high pressure hydrogen purge in a radical treatment chamber, which is conventionally kept a low pressure to ignite plasma up to about 20 Torr.

Figure 6A:
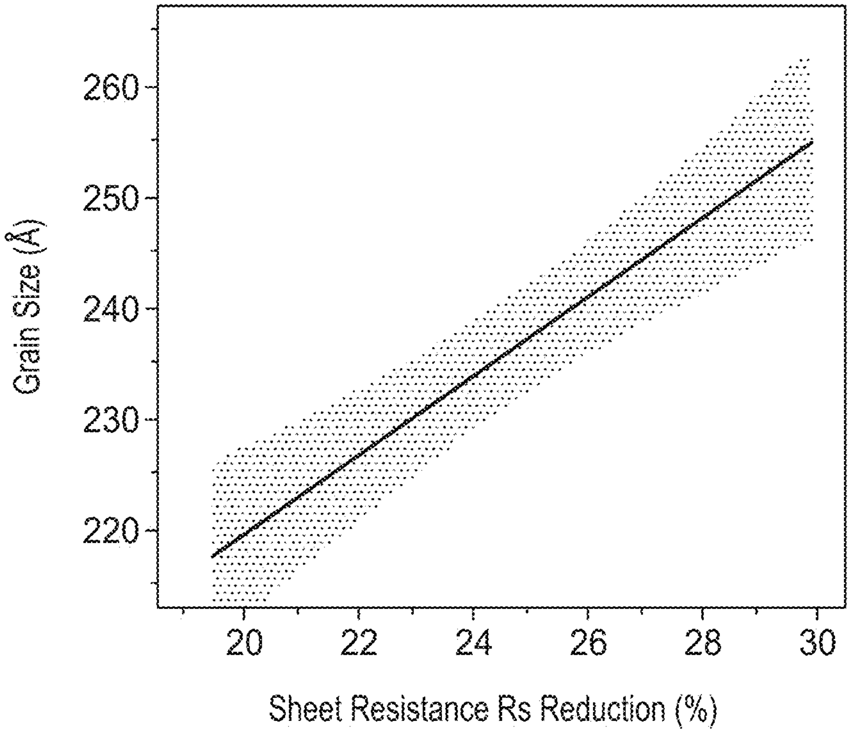

FIGS. 6A and 6B show correlation between Cu grain size and sheet resistance $R_s$ of the metal layer 510 of the film stack in various implementations shown in FIGS. 5B and 5C. It can be seen that sheet resistance $R_s$ decreases approximately linearly as the Cu grain size increases.

In accordance with the present disclosure, it is believed that Implementation #7 facilitates achieving the largest reduction in sheet resistance $R_s$ of the metal layer 510 in a film stack.

Benefits of the present disclosure include reduced sheet resistances (such as sheet resistances of one or more metals, for example, Cu (Copper), in a film stack) and increased grain sizes. Such benefits can be facilitated at the back end of line (BEOL) film stacks.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

The invention claimed is:

1. A method of post-deposition processing, comprising:

performing a preheat process in a radical treatment chamber, the preheat process comprising exposing a substrate having a metal layer formed thereon to purge gas and purging the purge gas at a pressure of between 400 Torr and 535 Torr; and subsequent to the preheat process, performing a radical treatment process in the radical treatment chamber, the radical treatment process comprising exposing the substrate to radical species.

2. The method of claim 1, wherein the metal layer comprises copper (Cu).

3. The method of claim 1, further comprising:

performing a thermal anneal process in the radical treatment chamber, the thermal anneal process comprising exposing the substrate to the purge gas and purging the purge gas at a pressure of between 500 Torr and 535 Torr.

4. The method of claim 1, further comprising:

performing a thermal anneal process in a thermal anneal chamber that is coupled to the radical treatment chamber, the thermal anneal process comprising exposing the substrate to the purge gas and purging the purge gas at a pressure of between 400 Torr and 535 Torr.

5. The method of claim 1, wherein the purge gas comprises hydrogen ($H_2$) gas.

6. The method of claim 5, wherein the preheat process is performed at a temperature of between 350 degrees Celsius for a time of between 1 minute and 10 minutes at a flow rate of the purge gas of between 10 liters per minute (LPM) and 12 LPM.

7. The method of claim 1, wherein the radical species comprise hydrogen radicals.

8. The method of claim 7, wherein the radical treatment process is performed at a temperature of between 350 degrees Celsius and at a pressure of between 0.35 Torr and 0.45 Torr for a time of between 1 minute and 60 minutes at a flow rate of the hydrogen radicals of between 1,300 sccm and 2,200 sccm.

9. A method of post-deposition processing, comprising:

performing a preheat process in a radical treatment chamber, the preheat process comprising exposing a substrate having a metal layer formed thereon to purge gas and purging the purge gas at a pressure of between 500 Torr and 535 Torr;

subsequent to the preheat process, performing a radical treatment process in the radical treatment chamber, the radical treatment process comprising exposing the substrate to radical species; and subsequent to the radical treatment process, performing a thermal anneal process in the radical treatment chamber, the thermal anneal process comprising exposing the substrate to the purge gas and purging the purge gas at a pressure of between 400 Torr and 535 Torr.

10. The method of claim 9, wherein the metal layer comprises copper (Cu).

11. The method of claim 9, wherein the purge gas comprises hydrogen ($H_2$) gas.

12. The method of claim 11, wherein the preheat process is performed at a temperature of between 350 degrees Celsius for a time of between 1 minute and 10 minutes at a flow rate of the purge gas of between 10 liters per minute (LPM) and 12 LPM.

13. The method of claim 9, wherein the radical species comprise hydrogen radicals.

14. The method of claim 13, wherein the radical treatment process is performed at a temperature of between 350 degrees Celsius and at a pressure of between 0.35 Torr and 0.45 Torr for a time of between 1 minute and 60 minutes at a flow rate of the hydrogen radicals of between 1,300 sccm and 2,200 sccm.

* * * * *